(12) United States Patent
Thorne et al.

(10) Patent No.: US 8,237,275 B2
(45) Date of Patent: Aug. 7, 2012

(54) TUNGSTEN STIFFENER FOR FLEXIBLE SUBSTRATE ASSEMBLY

(75) Inventors: Sean Thorne, Colorado Springs, CO (US); Scott Popelar, Colorado Springs, CO (US)

(73) Assignee: Aeroflex Colorado Springs Inc., Colorado Springs, CO (US)

( * ) Notice: Subject to any disclaimer, the term of this patent is extended or adjusted under 35 U.S.C. 154(b) by 145 days.

(21) Appl. No.: 12/819,965

(22) Filed: Jun. 21, 2010

(65) Prior Publication Data

US 2011/0309491 A1    Dec. 22, 2011

(51) Int. Cl.
*H01L 23/48* (2006.01)
*H01L 23/52* (2006.01)
*H01L 29/40* (2006.01)

(52) U.S. Cl. .................. 257/737; 257/777; 438/121
(58) Field of Classification Search .................. 257/737, 257/777, 784, E21.059; 438/121
See application file for complete search history.

(56) References Cited

U.S. PATENT DOCUMENTS

| | | |
|---|---|---|
| 6,479,903 B2 | 11/2002 | Briar |
| 6,537,848 B2 * | 3/2003 | Camenforte et al. .......... 438/106 |
| 7,094,975 B2 * | 8/2006 | Chengalva et al. ........... 174/256 |
| 7,144,756 B1 | 12/2006 | Wang et al. |
| RE39,628 E | 5/2007 | Isaak |
| 7,211,889 B2 | 5/2007 | Shim |
| 7,394,028 B2 | 7/2008 | Cohn |
| 7,459,782 B1 | 12/2008 | Li |
| 7,538,421 B2 | 5/2009 | Chen |
| 7,638,813 B2 | 12/2009 | Kinsman |
| 7,741,160 B1 * | 6/2010 | Wang et al. ................... 438/122 |
| 7,982,307 B2 * | 7/2011 | Amin et al. .................... 257/712 |
| 2006/0118947 A1 * | 6/2006 | Yuan et al. ..................... 257/706 |

* cited by examiner

*Primary Examiner* — Phuc Dang
(74) *Attorney, Agent, or Firm* — William J. Kubida; Peter J. Meza; Hogan Lovells US LLP

(57) ABSTRACT

A flexible semiconductor package is formed by interposing a flexible substrate between a tungsten stiffener and a die. A tungsten stiffener is bonded to a first surface of the flexible substrate prior to flip chip bonding or die attach of a die to a second surface of the flexible substrate. The tungsten stiffener is dimensioned so as to substantially overlap the die and provide a rigid and flat surface on which the die/flexible substrate bonding occurs. The flat and rigid characteristic of a tungsten stiffener optimizes the electrical and mechanical bond between the die and the flexible substrate as well as minimizing CTE mismatch.

20 Claims, 4 Drawing Sheets

TUNGSTEN STIFFENER FOR FLEXIBLE SUBSTRATE ASSEMBLY

BACKGROUND OF THE INVENTION

1. Field of the Invention

Embodiments of the present invention relate, in general, to flip chip and wirebond packaging structures and methods for manufacturing the same and more particularly to flip chip and wirebond on flexible substrates with matching coefficient of thermal expansion stiffeners and their corresponding manufacturing methods.

2. Relevant Background

In semiconductor devices assembly, a semiconductor chip (also referred to as an integrated circuit (IC) chip or "die") may be bonded directly to a packaging substrate. Recall that traditional semiconductor fabrication chips are built in large numbers on a single wafer wherein individual chips are patterned to have small pads of metal that serve as connection points to an eventual mechanical carrier or substrate. The chip is then cut out of the wafer and attached to the substrate typically by a wire bonding process. These traces lead to pins which are attached to the rest of the circuitry making up an electronic system.

Flip chip processing is similar to conventional die fabrication with a few additional steps. At the end of the manufacturing process attachment pads are metalized to make them more receptive to flip chip bumps. A small amount of conductive material such as gold or solder (referred to as a bump) is deposited on each of the metal pads. The chips are then cut out of the wafer and flipped or inverted to bring the bumps down onto pads of the underlying substrate, electronics or circuit board. The bumps are then connected via various assembly processes to produce an electrical connection. Packages of this type are referred to as flip chip packages.

In a conventional flip chip package, the die and packaging substrate are electrically connected and mechanically bonded in a solder joining operation. The die is aligned with and placed onto a packaging substrate such that the die's solder bumps are aligned with the metal pads on the substrate. Heat is applied causing the solder bumps to melt and alloy with the substrate pads forming electrical/mechanical connections between the die and the packaging substrate.

Underfill is then applied in order to enhance the mechanical bonding of the die and substrate. Underfill material is typically a thermal-set epoxy dispensed into the remaining space or gap between the die and substrate. In order to improve thermal performance and reliability of the package, heat spreaders are often used. A heat spreader may be of one-piece or multiple-piece construction. Occasionally, a stiffener is placed around the die on the same side of the substrate. The stiffener is typically a flat piece of high modulus metal having substantially same dimensions as the package substrate with a window in the center to clear the die. The purpose of the stiffener is to constrain the substrate to prevent warping or other movement which may be caused by thermal cycling during reliability testing or field operations.

Flip chip processing is not without its disadvantages. The chips require a very flat surface during bonding and it is difficult to arrange and maintain alignment as the boards heat and cool. Furthermore, the connections between the die and substrate are very short and stiff limiting their ability to withstand thermal expansion.

Another problem with flip chip package construction is that during the cool down from the solder joining temperatures and underfill curing, the entire package is highly stressed due to different coefficient for thermal expansion (CTE) of the substrate and die material. This problem is exasperated in the case of relatively large dies.

The semiconductor industry continually seeks to improve the electrical and mechanical performance of semiconductor die assemblies. However, thinner package substrates are more susceptible to warping resulting from CTE mismatches of material within the package as well as less inherent strength of the thin materials themselves.

Another advance in semiconductor packaging is the utilization of a flexible substrate. The top layer is a double-sided, flexible laminate to which chips are often flip chip attached. That is, solder joints are used to connect the die to the flexible substrate. The flexible nature of the substrate exasperate the challenges presented in assembly. Thermal management, substrate flatness and alignment during manufacturing all become major issues. These and other challenges of the prior art are addressed by one or more embodiments of the present invention, hereafter described by way of example.

SUMMARY OF THE INVENTION

A tungsten stiffener is combined with a die and a flexible substrate to provide a more reliable and durable connective bond at a yield greater than what would be realized without the presence of the stiffener. According to one embodiment of the present invention, a tungsten stiffener is bonded to a first surface of a flexible substrate prior to the substrates' combination with a die. The connection between the die and a flexible substrate can be either by flip chip bonding, wire bonding or by other bonding techniques as would be known to one of ordinary skill in the relevant art.

According to one embodiment of the present invention a flexible structure semiconductor package is comprised of a flexible substrate having a first and second surface, as well as a tungsten stiffener. The flexible substrate is interposed between the tungsten stiffener and a die. According to one embodiment of the present invention the tungsten substrate is dimensioned to be substantially larger than the die and positioned to overlap the die as oriented on the flexible substrate. By bonding the tungsten stiffener to the flexible substrate prior to attaching the die to the flexible substrate, the connections between the die and the flexible substrate can be consistently achieved under minimal stress.

The features and advantages described in this disclosure and in the following detailed description are not all-inclusive. Many additional features and advantages will be apparent to one of ordinary skill in the relevant art in view of the drawings, specification, and claims hereof. Moreover, it should be noted that the language used in the specification has been principally selected for readability and instructional purposes and may not have been selected to delineate or circumscribe the inventive subject matter; reference to the claims is necessary to determine such inventive subject matter.

BRIEF DESCRIPTION OF THE DRAWINGS

The aforementioned and other features and objects of the present invention and the manner of attaining them will become more apparent, and the invention itself will be best understood, by reference to the following description of one or more embodiments taken in conjunction with the accompanying drawings, wherein.

Figure 1:
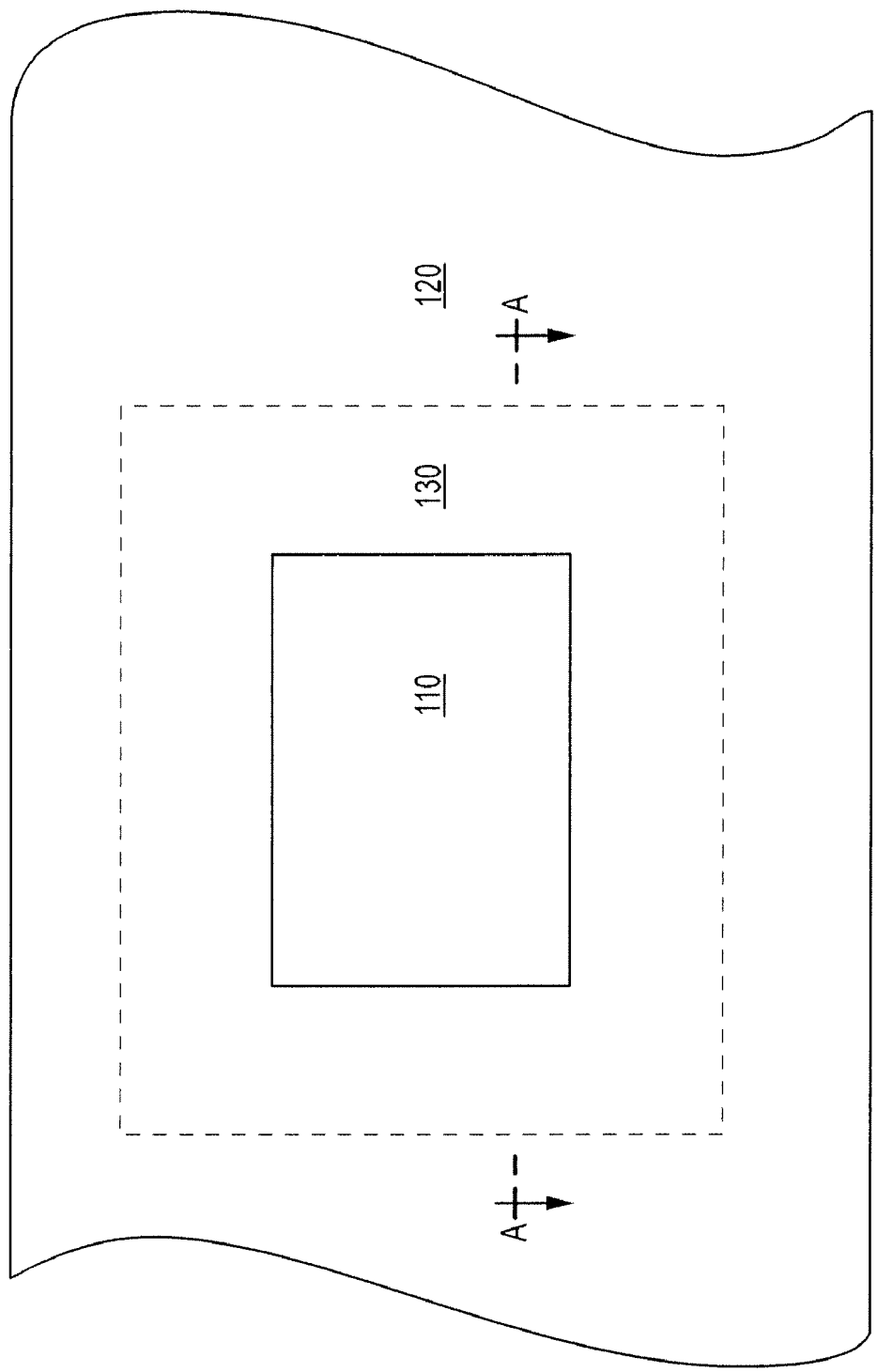
FIG. 1 shows a top view of a flexible semiconductor package utilizing a tungsten stiffener to stabilize the connective region between the die and flexible substrate according to one embodiment of the present invention.

The Figures depict embodiments of the present invention for purposes of illustration only. One skilled in the art will readily recognize from the following discussion that alternative embodiments of the structures and methods illustrated herein may be employed without departing from the principles of the invention described herein.

DESCRIPTION OF THE INVENTION

Embodiments of the present invention are hereafter described in detail with reference to the accompanying Figures. Although the invention has been described and illustrated with a certain degree of particularity, it is understood that the present disclosure has been made only by way of example and that numerous changes in the combination and arrangement of parts can be resorted to by those skilled in the art without departing from the spirit and scope of the invention.

The following description with reference to the accompanying drawings is provided to assist in a comprehensive understanding of exemplary embodiments of the present invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Included in the description are flowcharts depicting examples of the methodology which may be used to create a flexible semiconductor package having a tungsten stiffener. In the following description, it will be understood that each block of the flowchart illustrations, and combinations of blocks in the flowchart illustrations, can be, in one embodiment, implemented by various techniques. These instructions may be loaded onto a computer or other programmable apparatus to produce a machine such that the instructions that execute on the computer or other programmable apparatus create a means for implementing the functions specified in the flowchart block or blocks. These instructions may also be stored in a computer-readable memory that can direct a computer or other programmable apparatus to function in a particular manner such that the instructions stored in the computer-readable memory produce an article of manufacture including instruction means that implement the function specified in the flowchart block or blocks. The instructions may also be loaded onto a computer or other programmable apparatus to cause a series of operational steps to be performed a programmable apparatus to produce a computer implemented process such that the instructions that execute on the computer or other programmable apparatus provide steps for implementing the functions specified in the flowchart block or blocks.

Accordingly, blocks of the flowchart illustrations support combinations of means for performing the specified functions and combinations of steps for performing the specified functions. It will also be understood that each block of the flowchart illustrations, and combinations of blocks in the flowchart illustrations, can be implemented by special purpose hardware-based systems that perform the specified functions or steps, or combinations of special purpose hardware and computer instructions.

A flexible semiconductor package includes, according to one embodiment of the present invention, a flexible substrate bonded to a die or integrated circuit in which a tungsten stiffener is utilized to minimize movement and lower thermal stress between the flexible substrate and the die. By bonding the tungsten stiffener to the flexible substrate prior to attaching the die, movement between the die and the substrate can be minimized. Moreover, thermal stress due to mismatched coefficient of thermal expansion (CTE) can also be minimized as a CTE of tungsten and that of the die are substantially equal.

As can be appreciated by one of ordinary skill in the relevant art the use of a flexible substrate in semiconductor packaging provides numerous advantages as well as a few challenges. One significant challenge is the inability to consistently bond a die with the flexible substrate on a large scale. Another challenge is to match the CTE of the substrate with that of the die so as to minimize stress found in the connections formed during bonding.

According to one embodiment of the present invention and as shown in FIG. 1, a tungsten stiffener 130 is positioned to overlie a die 110 prior to the die's bonding/coupling with the flexible substrate 120. While the dimensions of FIG. 1 are not to scale it can be appreciated that the tungsten stiffener 130 is dimensioned to be substantially larger than the die 110. The stiffener 130 is also positioned to surround and overlie the footprint of the die 110 as oriented on the flexible substrate 120.

Figure 2:
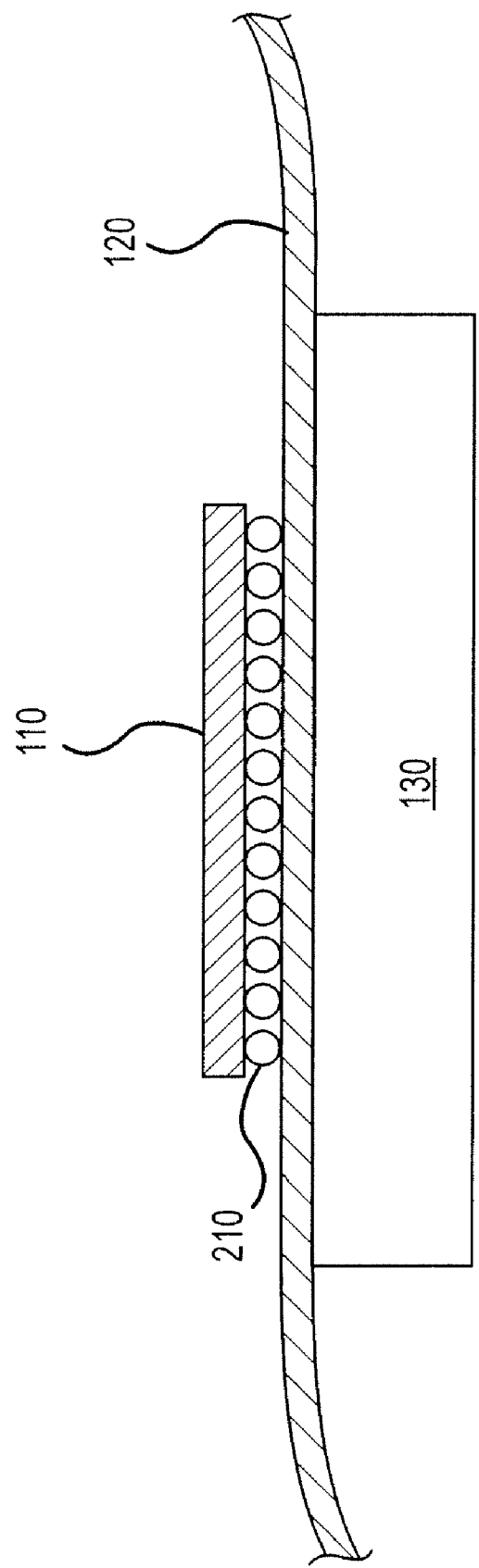
FIG. 2 shows a side view of a flip chip on flex bonding between the die and flexible substrate in which, according to one embodiment of the present invention, a tungsten stiffener is added to increase the rigidity of the flexible substrate surrounding the bonded region between the die and the substrate.

FIG. 2 is a cross section of the flexible semiconductor package shown in FIG. 1 at position A. According to one embodiment of the present invention, the die 110 can be a flip chip on flex bonded to the flexible substrate 120. As is well known to one of ordinary skill in the relevant art, a die 110 includes a plurality of bonding pads which are used to connect the die to trace connection points on the substrate. One method to bond the die to the substrate is referred to as flip chip bonding. According to one embodiment of the present invention and as depicted in FIG. 2, solder bumps 210 are positioned on each bonding pad of the die 110. The die 110 along with the solder bumps 210 are flipped over, flux is applied to the solder bumps to remove oxidation and the die is positioned on the flexible substrate 120 such that the bonding bumps 210 are aligned with trace connection points on the flexible substrate 120.

The die 110 and a flexible substrate 120 are electrically connected and mechanically bonded by the solder bumps 210. This is accomplished by a reflow process in which the semiconductor package is heated and the solder melts. Prior to bonding the die to the substrate, solder flux is applied to either the front surface of the die or the back surface of the substrate to remove oxidation during the bonding process. The flux serves primarily to aid the flow of the solder such that the solder bumps form a good contact with the trace connection points in the substrate. Heat, generally about 30° C. above the solder bump melt temperature, is applied to one or more of the die/substrate combinations causing the bumps to alloy (melt) and form electrical/mechanical connection. The packages then cool to harden the connection.

An underfill is generally thereafter applied in order to enhance the mechanical bonding of the die and substrate. Ideally, the underfill has a CTE matching that of the die and substrate. In some cases, the underfill flow is further assisted by using a vacuum or alternatively by injection so as to fill the gaps between the die and substrate. The underfill is then cured by heating the substrate and die to appropriate curing temperature which is held for a period of time and slowly cooled. In this manner, bonds are formed creating an electrically and mechanically bonded semiconductor package in which the die is coupled to the flexible substrate with an underfill that aids to distribute both mechanical and thermal stress.

The flexible nature of the substrate 120 complicates the reflow process by negating a stable and flat surface on which to form the connections between the die 110 and the trace connection points. Moreover, a CTE mismatch within the substrate itself and between the substrate and the die can cause the package to warp, placing the newly formed electrical connections between the die and the substrate in stress.

According to one embodiment of the present invention, a tungsten stiffener is bonded to the flexible substrate prior to joining the die to the flexible substrate. The tungsten stiffener keeps the surface of the flexible substrate flat during the reflow and underfill operation. This allows constant solder interconnects to be formed during a reflow as well as a complete and uniform underfill. As a result, a flexible semiconductor package can be manufactured that is both reliable and durable. Moreover, a closer CTE match between the die and the stiffener material minimizes stress within the bonds and underfill interface. CTE mismatch between die and substrate stiffener is the leading cause of stress within flexible semiconductor packages and the use of a tungsten stiffener significantly minimizes this effect.

Figure 3:
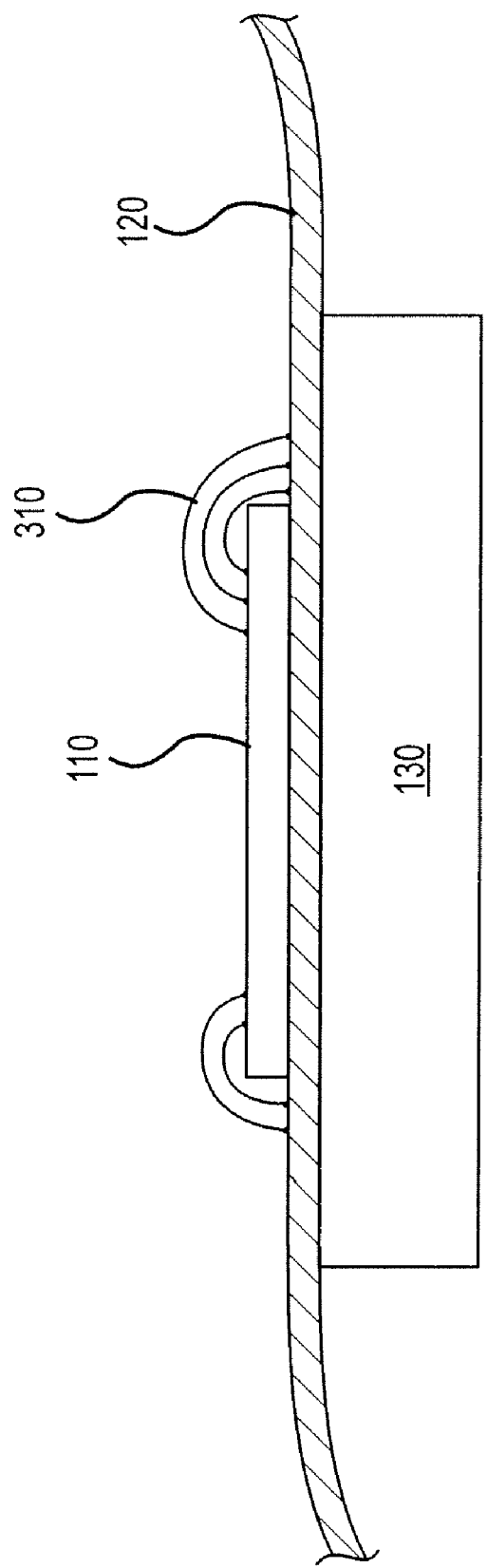
FIG. 3 shows a cross section side view of a wire bonded connection between the die and a flexible substrate in which, according to one embodiment of the present invention, the tungsten is added to increase the rigidity of the flexible substrate surrounding the region between the die and substrate as well as the wirebond connections.

FIG. 3 shows an alternate embodiment of the present invention in which the die 110 is coupled to the flexible substrate 120 using a wire bonding process. As will be understood by one of ordinary skill in the relevant art, bonding pads associated with the die 110 are joined to the trace connection points associated with the flexible substrate 120 via wire bonds 310. As with the solder interconnects of the previously described flip chip process, the wire bonds can come under significant stress as a flexible substrate moves and/or when a mismatch between the CTE and the die in the substrate exists.

For flexible semiconductor packages utilizing wire bonding, a tungsten stiffener provides a consistent, flat surface not only for die attachment but also for subsequent wire bonding operations. The tungsten stiffener prevents movement of the bond created between the flexible substrate trace connection points and the die bonding pads. As with the flip chip design the tungsten stiffener provides a higher reliability, a higher yield and better thermal performance as compared to traditional stiffener materials and processes.

One significant departure of the present invention from the prior art is that the tungsten stiffener is joined with a flexible substrate prior to the substrate's bonding with the die. Moreover, and as shown in FIGS. 2 and 3 of present invention, the tungsten stiffener 130 is bonded to the opposite side of the flexible substrate 121 to which the die is attached 110. More concisely, the flexible substrate 120 is interposed between the die 110 and the tungsten stiffener 130.

While the present invention has been described by using a tungsten stiffener to minimize the CTE mismatch and to provide a rigid yet flat surface so as to optimize the bond between the flexible substrate and the die, one of ordinary skill in the relevant art will appreciate that other material beyond tungsten may be used as a stiffener. Similarly, while the dimensions of the die, stiffener and substrate may vary, the fundamental concept of placing the said substrate between the die and the stiffener so as to minimize movement and CTE mismatch remains the same.

According to one preferred embodiment of the present invention, a flexible semiconductor package utilizing a tungsten stiffener can comprise a flexible substrate of approximately 50 μm in thickness joined with a tungsten stiffener approximately 250 to 380 μm thick. In other applications, the flexible substrate may vary in thicknesses. Copper, or other conductive materials, is embossed on one or both sides of the flexible substrate. Solder masking thereafter defines the trace connection points on the flexible substrate. Typical flexible substrate thicknesses, with all the components described above, are on the order of 75-125 microns.

For flexible semiconductor packages utilizing flip chip on flex processing, the pitch for the solder bumps may vary considerably based on the center of the solder bump to the center of the next solder bump. This is driven primarily by the flexible substrate manufacturing technology.

In most cases, the tungsten stiffener is at least one millimeter larger than the die size in both X and Y dimensions. The overlap of the tungsten stiffener ensures that a flat, rigid surface of the flexible substrate is available for bonding to the die. The thickness and dominant CTE of the tungsten stiffener provides a substantially equal CTE match between the die and flexible substrate/tungsten stiffener combination.

Figure 4:
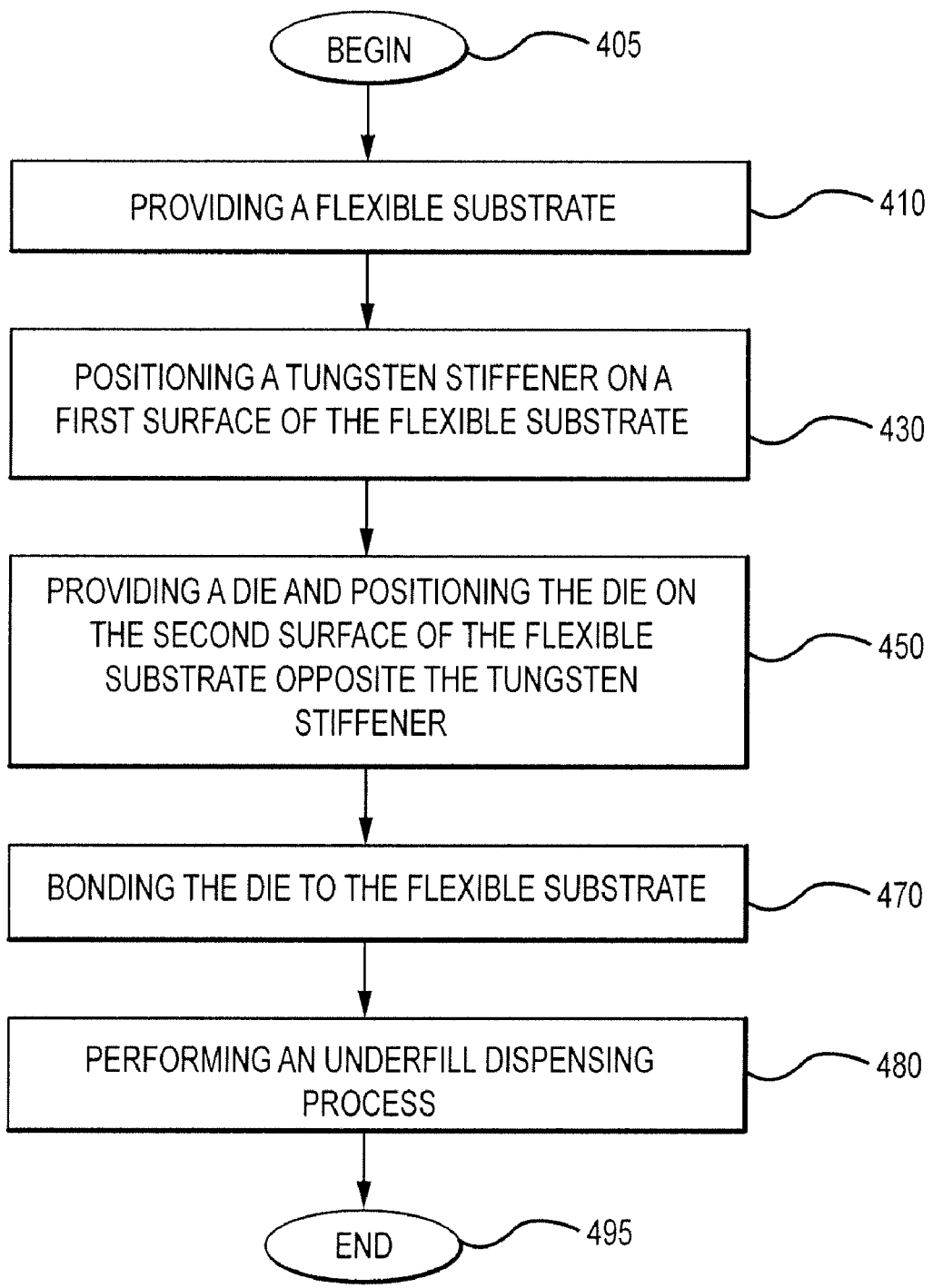
FIG. 4 is a flow chart depicting one method embodiment of a process for forming a flexible semiconductor package including a tungsten stiffener according to the present invention.

FIG. 4 shows a flow chart of one method embodiment for forming a flexible semiconductor package utilizing a tungsten stiffener. The process begins 405 by providing a flexible substrate 410 on which to bond a die. Prior to bonding the die to the flexible substrate, a tungsten stiffener is positioned 430 on a first surface of the flexible substrate. Thereafter, the die is positioned on the second surface opposite of the tungsten stiffener 450.

With the flexible substrate being constrained to be both locally rigid and flat and the die positioned so as to mate the die bonding pads with the trace connection points of the flexible substrate, the die and flexible substrate are bonded 470. In one embodiment of the present invention, the bonding between the flexible substrate and the die is accomplished by flip chip bonding in which solder bumps positioned on each bonding pad of the die are aligned with the trace connection points associated with the flexible substrate. Once the proper alignment has been achieved, the die/flexible substrate combination, along with the tungsten stiffener opposite the die, are placed through a reflow process in which the solder bumps alloy and form mechanical and electrical connections between the die and flexible substrate. In this embodiment of the present invention, post-bonding the die to the flexible substrate, an underfill is dispensed 480 and cured in the space between the die and applicable substrate filling any gaps and enhancing the mechanical connection ending the fabrication process 495.

In another embodiment of the present invention, the die and flexible substrate are bonded by forming electrical connections between the die bonding pads and trace connection points of the flexible substrate using wire bonds. As one of ordinary skill in the relevant art will appreciate, other fabrication processes consistent with the present invention are possible without departing from the scope and intent of the present invention.

While there have been described above the principles of the present invention in conjunction with a flexible semiconductor package utilizing a tungsten stiffener, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features that are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The Applicant hereby reserves the right to formulate new claims to such features and/or combinations of such features during the prosecution of the present application or of any further application derived therefrom.

We claim:

1. A flexible structure semiconductor package, comprising:
   a flexible substrate having a first surface and a second surface;
   a stiffener coupled to the second surface of the flexible substrate wherein the stiffener is comprised of Tungsten; and
   a die coupled to the first surface of the flexible substrate,
   wherein a coefficient of thermal expansion of the flexible substrate, the stiffener, and the die are substantially equal.

2. The flexible structure semiconductor package of claim 1 wherein the die is flip chip coupled to the first surface of the flexible substrate.

3. The flexible structure semiconductor package of claim 1 wherein the die is die attached and wire bond coupled to the first surface of the flexible substrate.

4. The flexible structure semiconductor package of claim 1 wherein the stiffener is coupled to the flexible substrate prior to the flexible substrate being coupled to the die and wherein the stiffener is larger than the die such that a plurality of die to flexible substrate electrical connections are supported by the stiffener.

5. The flexible structure semiconductor package of claim 1 wherein the die includes a plurality of bonding pads, each pad including a conductive flip chip bump.

6. The flexible structure semiconductor package of claim 5 wherein the first surface of the flexible substrate includes a plurality of electrical trace connections, each trace connection aligned with one conductive flip chip bump.

7. The flexible structure semiconductor package of claim 6 wherein each trace connection is conductively coupled to each pad via the conductive flip chip bump during a reflow process and wherein the stiffener maintains trace/pad alignment during the reflow process.

8. The flexible structure semiconductor package of claim 1 wherein the die includes a plurality of bonding pads configured for wire bond interconnect attach.

9. The flexible structure semiconductor package of claim 8 wherein the first surface of the flexible substrate includes a plurality of electrical trace connections, each trace connection wire bonded with one bonding pad forming a connection and wherein the stiffener minimizes stress and strain on the connection from movement of the flexible substrate.

10. The flexible structure semiconductor package of claim 8 wherein the first surface of the flexible substrate includes plurality of electrical trace connections, each electrical trace connection corresponding to one of the plurality of bonding pads.

11. The flexible structure semiconductor package of claim 10 wherein the die is die attached to the first surface of the flexible substrate and each of the plurality of electrical trace connections is conductively coupled to a corresponding one of the plurality of bonding pads via a wire interconnect bond and wherein the stiffener maintains the flexible substrate substantially rigid during wire bonding.

12. A method for forming a flexible substrate semiconductor package, the method comprising:
   providing a die wherein the die includes a plurality of bonding pads;
   providing a flexible substrate wherein the flexible substrate includes a first surface and a second surface wherein the first surface of the flexible substrate includes a plurality of electrical trace connection points;
   bonding a Tungsten stiffener to the second surface of the flexible substrate wherein the stiffener locally increases the rigidity of the plurality of electrical trace connection points; and
   coupling the die to the flexible substrate,
   wherein a coefficient of thermal expansion of the flexible substrate, the stiffener, and the die are substantially equal.

13. The method for forming a flexible substrate semiconductor package of claim 12 wherein the stiffener is bonded to the flexible substrate prior to coupling the die to the flexible substrate.

14. The method for forming a flexible substrate semiconductor package of claim 12 wherein the stiffener is substantially larger than the die so as to support a plurality of die to flexible substrate electrical connections.

15. The method for forming a flexible substrate semiconductor package of claim 12 wherein each bonding pad includes a conductive flip chip bump.

16. The method for forming a flexible substrate semiconductor package of claim 15 aligning the die with the flexible substrate so that each conductive flip chip bump of the die is aligned with one electrical trace connection point of the flexible substrate.

17. The method for forming a flexible substrate semiconductor package of claim 16 wherein the die is flip chip coupled to the flexible substrate.

18. The method for forming a flexible substrate semiconductor package of claim 12 wherein the die is includes a plurality of bonding pads configured for wire bond interconnect attach.

19. The method for forming a flexible substrate semiconductor package of claim 18 wherein the die is die attached to the first surface of the flexible substrate and wherein each of the plurality of wire trace connection points on the flexible substrate are coupled to a corresponding one of the plurality of bonding pads via a wire interconnect.

20. The method for forming a flexible substrate semiconductor package of claim 19 wherein the stiffener minimizes stress and strain on each wire interconnect due to movement of the flexible substrate.

* * * * *